United States Patent [19]

Adachi

[11] Patent Number: 5,124,778
[45] Date of Patent: Jun. 23, 1992

[54] CMOS SEMICONDUCTOR INTEGRATED CIRCUIT DEVICE

[75] Inventor: Takao Adachi, Tokyo, Japan
[73] Assignee: NEC Corporation, Japan
[21] Appl. No.: 591,086
[22] Filed: Oct. 1, 1990

[30] Foreign Application Priority Data

Sep. 29, 1989 [JP] Japan .................. 1-254355

[51] Int. Cl.$^5$ .......................................... H01L 27/02
[52] U.S. Cl. ...................................... 357/51; 357/42; 357/41
[58] Field of Search ............................ 357/42, 41, 51

[56] References Cited

U.S. PATENT DOCUMENTS 4,862,241 8/1989 Ashida et al. .................. 357/51

Primary Examiner—Edward J. Wojciechowicz
Attorney, Agent, or Firm—Laff, Whitesel, Conte & Saret

[57] ABSTRACT

A CMOS semiconductor integrated circuit device has an n-(p-)MOS element formed on a p-(n-)type semiconductor substrate and a p-(n-)MOS element formed on an n-(p-)type well region. A substrate potential wiring for providing a substrate potential to the p-(n-)type semiconductor substrate and a source potential wiring connected to the source region of the n-(p-)MOS are provided physically independently from each other, and such potential wiring and such source potential wiring are connected with each other with a resistor being interposed therebetween. Thus, the current which flows in transistors during the operating state of related circuits integrated in the substrate is prevented from flowing into the substrate thereby eliminating any such fluctuations of the substrate potential as may otherwise be caused by the operation of the circuits.

10 Claims, 3 Drawing Sheets

CMOS SEMICONDUCTOR INTEGRATED CIRCUIT DEVICE

BACKGROUND OF THE INVENTION

The present invention relates to a CMOS semiconductor integrated circuit device and, more particularly, to a CMOS semiconductor integrated circuit device in which any such malfunctions as may be caused by the charging and discharging of the CMOS buffer circuit is prevented from occurring in other CMOS circuits within the integrated circuit device.

As a conventional CMOS semiconductor integrated circuit device, there has been known a circuit in which, for example, an n-type MOS element is formed on a p-type semiconductor substrate and a p-type MOS element is formed on an n-type well region and in which the p-type region which is for providing a substrate potential to the p-type semiconductor substrate is connected, together with the source region of the n-type MOS, to the ground by a ground wiring and an n-type region which is for providing a well potential to the n-well region is connected, together with the source region of the p-type MOS circuit, to a power supply through a power supply wiring. The power supply wiring or the ground wiring to which an output buffer is connected allows the flow of a large current and this causes "power supply noise" due to fluctuations of the potential of the power supply wiring or the ground wiring during the operating state of the buffer. Such power supply noise can propagate to other circuits formed in the same substrate since the p-type region connected to the ground wiring is connected to the p-type regions formed at other parts through the substrate resistance. Normally, in order to stabilize the substrate potential or the well potential, the substrate or the well is connected to the ground wiring or the power supply wiring at a plurality of points.

SUMMARY OF THE INVENTION

It is, therefore, an object of the invention to overcome the problems existing in the conventional CMOS semiconductor device and to provide an improved CMOS semiconductor device.

It is another object of the invention to provide a CMOS semiconductor integrated circuit device comprising a first type MOS device formed on a first conductivity type semiconductor substrate, a second type MOS formed on a second conductivity type well region, a substrate potential wiring for providing a substrate potential to the first conductivity type semiconductor substrate, and a source potential wiring connected to the source region of the first type MOS device, the substrate potential wiring and the source potential wiring being provided individually and independently from each other, and the potential wiring and such source potential wiring being connected through a resistor interposed therebetween. The current which flows in transistors during the operating state of the related circuits is prevented from flowing into the substrate thereby eliminating any such fluctuations of the substrate potential as may otherwise be caused by the operation of the circuits.

According to one feature of the present invention, a CMOS semiconductor integrated circuit device comprises:

a power supply line (a first operating potential line) and a ground line (a second operating potential line);

a first type MOS transistor formed in a first conductivity type semiconductor substrate;

a second type MOS transistor formed in a second conductivity type region;

first wiring means connected to the first conductivity type semiconductor substrate for providing a substrate potential to the substrate;

second wiring means for connecting a source region of the first type MOS transistor to the power supply line or the ground line, the first and second wiring means being physically separately provided from each other; and a resistor connected between the first wiring means and the second wiring means.

BRIEF DESCRIPTION OF THE DRAWINGS

The above and other objects, features and advantages of the present invention will be apparent from the following description of preferred embodiments according to the invention explained with reference to the accompanying drawings, in which.

PREFERRED EMBODIMENTS OF THE INVENTION

Throughout the following explanation, similar reference symbols or numerals refer to the same or similar elements in all figures of the drawings.

Figure 3A:
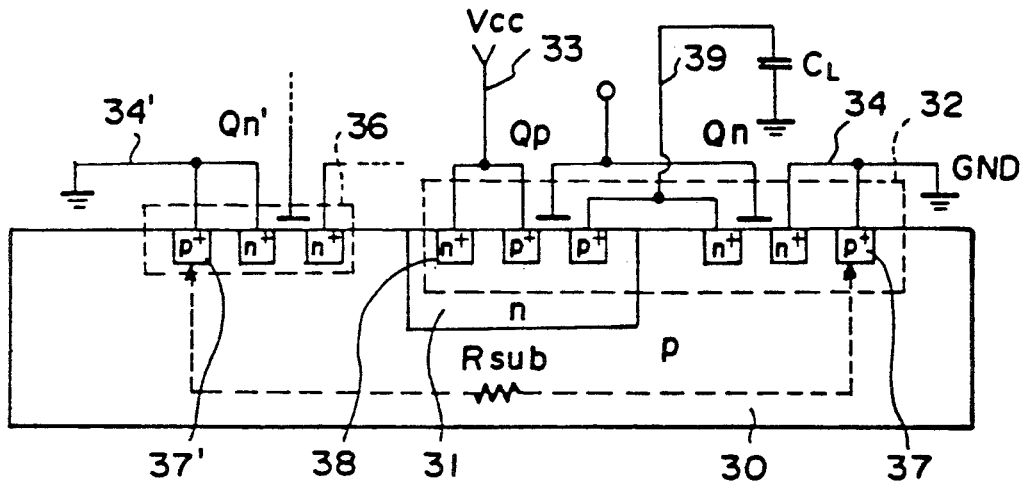
FIG. 3(a) is a sectional view of a prior art device.
Figure 3B:
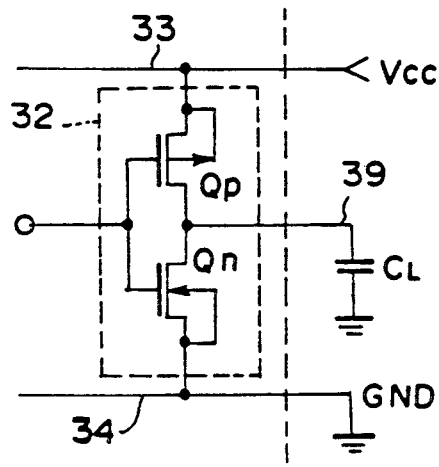
FIG. 3(b) is an equivalent circuit diagram for the prior art device shown by FIG. 3(a)
Figure 3C:
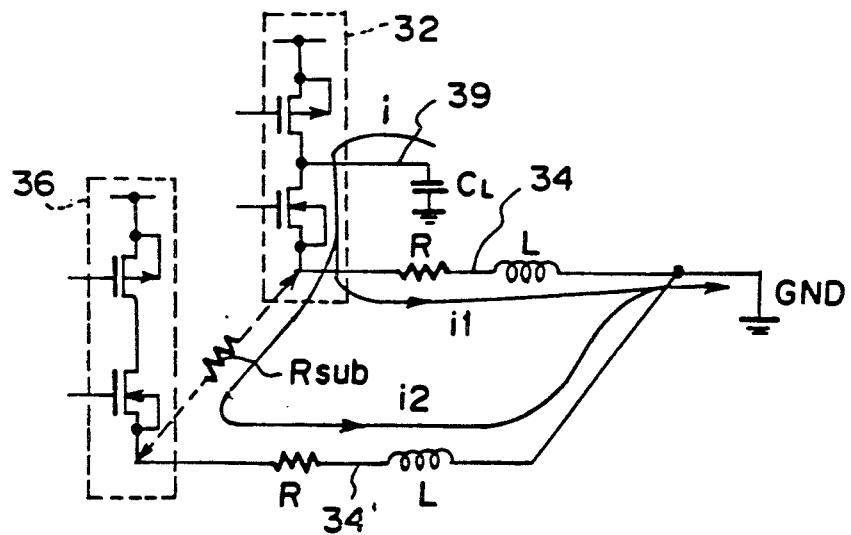
FIG. 3(c) is a diagram illustrating the operation of the prior art device shown by FIG. 3(b).

Firstly, for the purpose of assisting in the understanding of the present invention, a conventional CMOS semiconductor integrated circuit device and problems existing therein will be explained by making reference to FIGS. 3(a), 3(b) and 3(c) before the present invention is explained. A sectional view of a prior art CMOS semiconductor integrated circuit device is shown in FIG. 3(a) and an equivalent circuit of its CMOS buffer circuit 32 is shown in FIG. 3(b). In FIG. 3(a), an n-type well 31 is formed within a p-type semiconductor substrate 30. An n-channel MOS transistor Qn (hereinafter referred to as "n-MOS") which is one of the transistors constituting the CMOS buffer circuit 32 is formed on the p-type semiconductor substrate 30 and the other of the transistors which is a p-channel MOS transistor Qp (hereinafter referred to as "p-MOS") is formed within the n-type well 31. Also, on the p-type semiconductor substrate 30, is formed an n-MOS Qn' which constitutes another CMOS circuit 36.

A p+ type region 37 which is for providing a substrate potential to the p-type semiconductor substrate 30 is connected, together with the source region of the n-MOS Qn, to the ground GND by a ground wiring 34 and an n+ type region 38 which is for providing a well potential to the n-well is connected, together with the source region of the p-MOS Qp, to a power supply $V_{cc}$ through a power supply wiring 33. Normally, in order to stabilize the substrate potential or the well potential, the substrate or the well is connected to the ground wiring or the power supply wiring at a plurality of points. Especially, since there is a possibility for a latch-up phenomena, which is unique to CMOS circuits, to occur easily in the neighborhood of the n-MOS which constitutes the CMOS buffer circuit, the connection is made at a plurality of points and this is done in order to prevent the occurrence of such latch-up.

The drain region of the p-MOS and the n-MOS which constitute the CMOS buffer circuit 32 is connected to a load through an output line 39.

The CMOS buffer circuit in the conventional CMOS semiconductor integrated circuit device as explained above often needs to drive a large load because of the nature and the characteristics of such circuit. In such circuit, the charging and discharging currents to the load flow in the power supply wiring and the ground wiring which are connected to the CMOS buffer circuit. Such currents become large proportionally to the magnitude of the load and, especially in the power supply wiring and the ground wiring which are connected to the output buffer driving the external load, the charging and discharging currents are extremely large. Since these wirings have a resistance component and an inductance component, the flow of the currents as explained above causes the voltage drop and the potential rise. Especially, a spike type through current or a steep rise and fall of charging and discharging current which is unique to the CMOS buffer causes the generation of a large counterelectromotive force due to the inductance component. That is, during the operating state of the CMOS buffer, the potential of the power supply wiring or the ground wiring undergoes a large change or shows steep fluctuations or variation (as the so-called "power supply noise"). The extent of such fluctuations can sometimes reach several tens percent of the power supply voltage. However, with respect to the CMOS buffer, the tolerance of the input potential against the fluctuations of the source potential is large, the extent of fluctuations in the order of several tens percent of the power supply voltage falls short of causing the occurrence of malfunctions.

However, the p+ type region 37 connected to the ground wiring 34 is connected to a p+ type region 37', which is formed at a separate location, through the p-channel type semiconductor substrate 30, that is, through a substrate resistance $R_{sub}$. It is through this passage that the above-mentioned power supply noise, which in this example is a ground noise, propagates to circuits other than the CMOS buffer circuit 32 which is the source of the noise. This state is shown in FIG. 3(c). Now, it is assumed that the buffer circuit 32 is operated so as to discharge the charge charged in the load capacitance $C_L$. The discharging current flows into the ground line through the ground wiring 34 to which the buffer circuit is connected. This current causes the potential of the p+ type region 37 to rise due to the resistance component R and the inductance component L of the wiring 34. Therefore, due to the substrate resistance $R_{sub}$, the current shunts to a separate CMOS circuit 36, as a current $i_2$. This current $i_2$ causes the potentials of the source region and the p+ type region 37' of the n-MOS Qn' to fluctuate due to the resistance and inductance components of the ground wiring 34' in the CMOS circuit 37. Thus, in the case where the CMOS circuit 36 is a circuit for detecting a very small quantity of current or voltage as in a sense amplifier, the sense amplifier circuit undergoes malfunctions.

To solve the problem, the present invention provides a CMOS semiconductor integrated circuit device which comprises an n-(p-)MOS formed on a p-(n-)type semiconductor substrate and a p-(n-)MOS formed on an n-(p-)type well region and in which a substrate potential wiring for providing a substrate potential to the p-(n-)type semiconductor substrate and a source potential wiring connected to the source region of the n-(p)MOS are of separate wirings, and the substrate potential wiring and the source potential wiring are connected with each other at a single point through a resistor.

Now, some preferred embodiments of the present invention are explained with reference to the appended drawings.

Figure 1A:
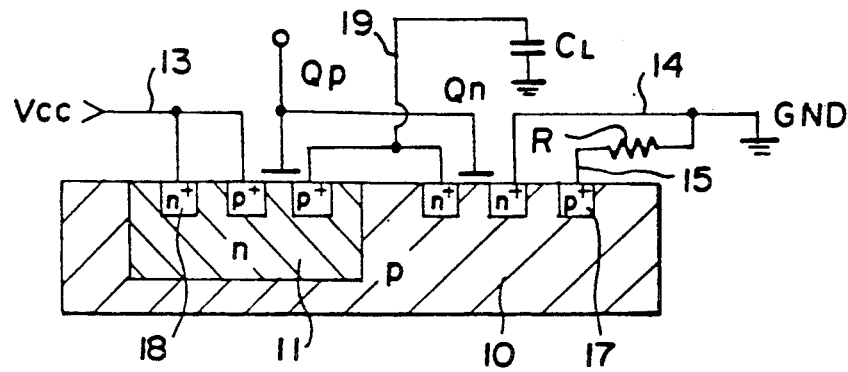
FIG. 1(a) is a sectional view of the device according to the first embodiment of the present invention.
Figure 1B:
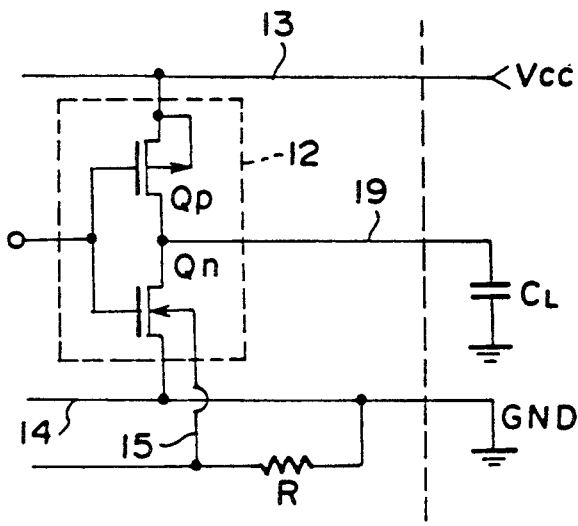
FIG. 1(b) is an equivalent circuit diagram for the device of FIG. 1(a)

FIG. 1(a) is a sectional view of the device according to a first embodiment of the present invention and FIG. 1(b) is an equivalent circuit diagram thereof. In FIG. 1, the parts or elements corresponding to those in the conventional device shown in FIGS. 3(a)-3(c) have been assigned the common numerals for their last digit so that the same explanation is not repeated for the same parts or elements. The feature in the present embodiment which is different from the prior art arrangement is that, although the source region of n-MOS transistor Qn of a CMOS buffer circuit 12 is connected to the ground potential GND through a ground wiring 14, a p+ type region 17 for providing the substrate potential to a p-type semiconductor substrate 10 is connected to a substrate potential wiring 15 which is a wiring different from the ground wiring 14 and the substrate potential wiring 15 is connected to the ground wiring 14 through a resistor R.

Figure 1C:
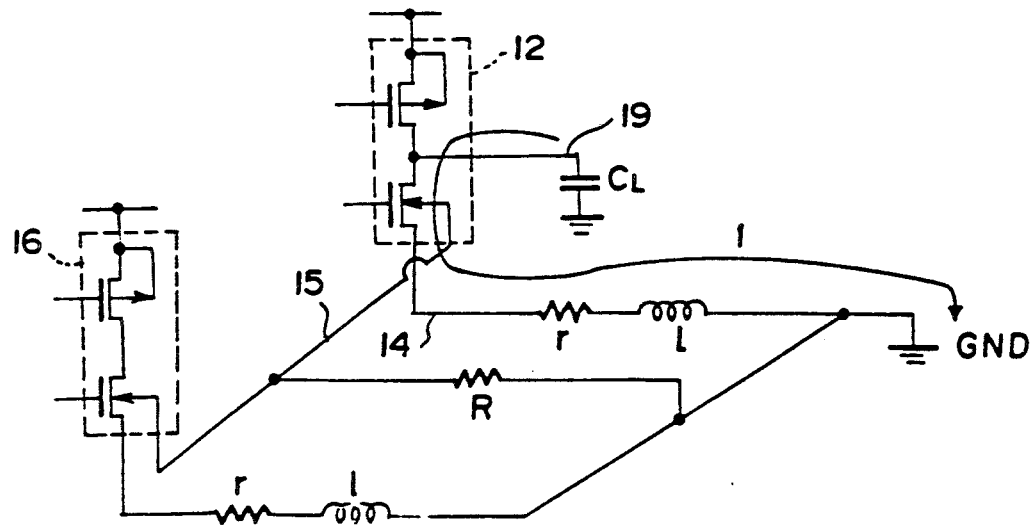
FIG. 1(c) is a diagram illustrating the operation of the circuit shown by FIG. 1(b)

Next, the operation of the circuit device according to this embodiment is explained with reference to FIG. 1(c). Now, let us assume that the CMOS buffer circuit 12 discharges the charge charged in the load capacitance $C_L$ and the discharging current i flows into the ground GND through the ground wiring 14. Since the resistance r and the inductance l exist in the ground wiring 14, there occur potential fluctuations in the ground wiring, which are dependent on the changes in the magnitude of the current and the amount of the current changes with time. However, in the CMOS buffer circuit according to the present embodiment, the ground wiring 14 and the substrate potential wiring 15 are provided physically independently with each other, and as a result, the potential fluctuations occurring at the ground wiring 14 do not propagate to the semiconductor substrate 10. Thus, there is no possibility for the substrate potential of any other CMOS circuits 16 formed on the same substrate to undergo any changes and this eliminates a fear of the occurrence of any such malfunctions as may be caused by changes in the substrate potential. The substrate potential line 15 is connected to the ground line 14 at a single point through the resistor R. The resistor R serves to prevent any reverse flow of the operation current from the ground line 14.

Figure 2A:
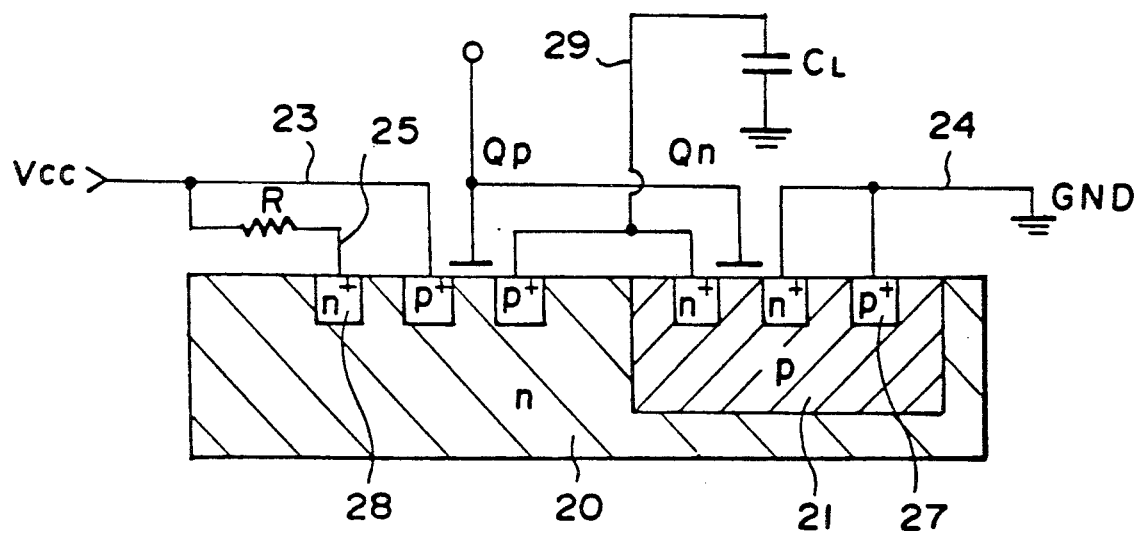
FIG. 2(a) is a sectional view of the device according to the second embodiment of the present invention.
Figure 2B:
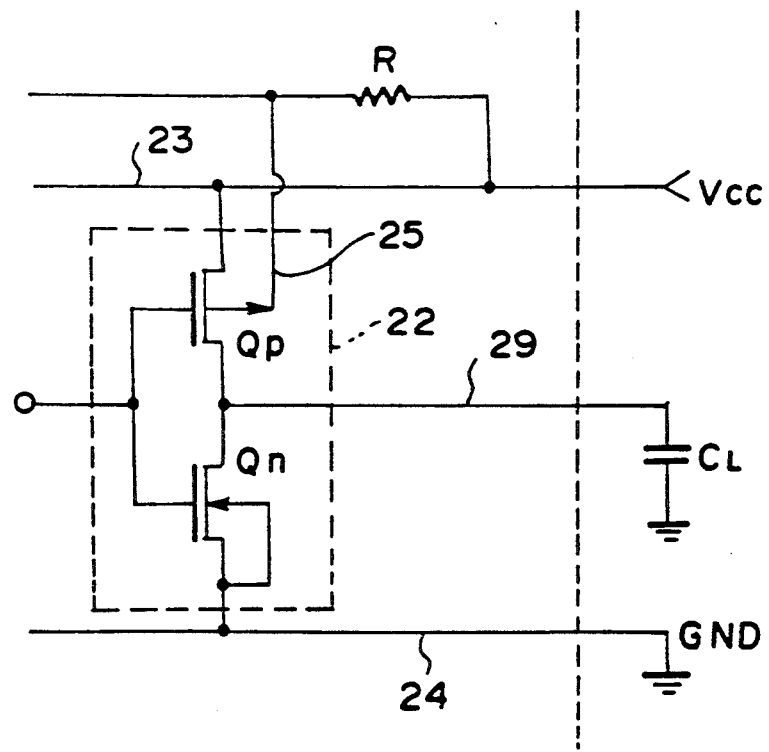
FIG. 2(b) is an equivalent circuit diagram for the device of FIG. 2(a)

FIG. 2(a) shows a sectional view of the device according to the second embodiment of the present invention and FIG. 2(b) shows an equivalent circuit diagram of the same. In the device of this embodiment, the p-MOS Qp of a CMOS buffer circuit 22 is formed on an n-type semiconductor substrate 20 and the n-MOS Qn of the CMOS buffer circuit 22 is formed on a p-type well 21 in the substrate 20. Further, the source region of the n-MOS Qn and the p+ type region 27 which is for providing a well potential are connected to the ground GND through a ground wiring 24 and the source region of the p-MOS Qp is connected to the power supply $V_{cc}$ through a power supply wiring 23. Also, an n+ type region 28 is formed in the n-type semiconductor substrate 20 is connected to a substrate potential wiring 25 which is at only one point connected to the power supply wiring 23 through a resistor R. The drains of the two CMOS transistors Qp, Qn are connected to the load $C_L$ through an output line 29.

In the circuit according to this embodiment, the potential fluctuations in the power supply line 23 to be caused by the charging current when the load capacitance $C_L$ is charged are prevented from propagating into the n-type semiconductor substrate, and this is achieved by the arrangement wherein the power supply wiring 23 and the substrate potential wiring 25 are disposed separately from each other.

As explained above, the CMOS semiconductor integrated circuit device according to the present invention is arranged such that the ground wiring (or the power supply wiring) connected to the source region and the substrate potential wiring for providing the substrate potential are of separate wirings so that, according to the present invention, the current which flows in transistors during the operating state of related circuits integrated in the substrate is prevented from flowing into the substrate. Therefore, in the device according to the present invention, there are no such fluctuations of the substrate potential as may be caused by the operation of the circuits and this ensures the stability of the operation in all the related circuits within the integrated circuit device. Elimination of any fear of the occurrence of malfunctions is significant especially in circuits dealing with a minute current or voltage.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A CMOS semiconductor integrated circuit device comprising:
    a ground line;
    a first type MOS transistor having a source region and being formed in a first conductivity type semiconductor substrate;
    a second type MOS transistor formed in a second conductivity type semiconductor region in said substrate;
    a first wiring and a resistor connected in series between said ground line and said first conductivity type semiconductor substrate for providing a substrate potential; and
    a second wiring connected directly between said source region of said first type MOS transistor and said ground line, said second wiring being a wiring which is separate from said first wiring.

2. A CMOS semiconductor integrated circuit device comprising:
    a power supply line;
    a first type MOS transistor formed in a first conductivity type semiconductor substrate;
    a second type MOS transistor having a source region and being formed in a second conductivity type semiconductor region in said substrate;
    a first wiring and a resistor connected in series between said power supply line and said first conductivity type semiconductor substrate for providing a substrate potential; and
    a second wiring connected directly between said source region and said first type MOS transistor and said power supply line, said second wiring being a wiring which is separate from said first wiring.

3. A CMOS semiconductor circuit device according to claim 1, in which said first type MOS transistor is an n-type MOS transistor, said second type MOS transistor is a p-type MOS transistor, said first conductivity type semiconductor substrate is a p-type semiconductor substrate, and said second conductivity type semiconductor region is an n-type semiconductor region.

4. A CMOS semiconductor circuit device according to claim 2, in which said first type MOS transistor is a p-type MOS transistor, said second type MOS transistor is an n-type MOS transistor, said first conductivity type semiconductor substrate is an n-type semiconductor substrate, and said second conductivity type semiconductor region is a p-type semiconductor region.

5. A CMOS semiconductor circuit device according to claim 1, in which said first wiring for the substrate potential and said second wiring for the source potential are connected to each other at a single point.

6. A CMOS semiconductor circuit device according to claim 2, in which said first wiring for the substrate potential and said second wiring for the source potential are connected to each other at a single point.

7. A CMOS semiconductor circuit device according to claim 1, in which said first wiring is a substrate potential wiring and said second wiring is a ground wiring.

8. A CMOS semiconductor circuit device according to claim 2, in which said first wiring is a substrate potential and said second wiring is a power supply wiring.

9. A CMOS semiconductor integrated circuit device comprising:
    a first operating potential line and a second operating line;
    a first type MOS transistor having a source region and being formed in a first conductivity type semiconductor substrate;
    a second type MOS transistor having a source region and being formed in a second conductivity type semiconductor region in said substrate;
    first wiring means having a resistivity and being connected between one of said first and second operating potential lines and said first conductivity type semiconductor substrate, said first wiring means applying a substrate potential to said substrate;
    second wiring means connected directly between one of said source regions of said first type and second type MOS transistors and one of said first and second operating potential lines, said second wiring means being disposed physically independently from said first wiring means,
    whereby an operation current flowing in said first and second MOS transistors is prevented from flowing into said semiconductor substrate.

10. A CMOS semiconductor integrated circuit device according to claim 9, in which said first type MOS transistor and said second type MOS transistor constitute a CMOS buffer circuit with said buffer circuit and other CMOS circuits being formed in the same substrate, said resistive means serving to prevent the occurrence of malfunctions in said other CMOS circuits during the operation of said CMOS buffer circuit.

* * * * *